(12) United States Patent
Wada et al.

(10) Patent No.: US 11,942,347 B2
(45) Date of Patent: Mar. 26, 2024

(54) STORAGE SYSTEM

(71) Applicant: MURATA MACHINERY, LTD., Kyoto (JP)

(72) Inventors: Eiji Wada, Inuyama (JP); Yoshiki Yuasa, Inuyama (JP); Kosuke Irino, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 393 days.

(21) Appl. No.: 17/415,762

(22) PCT Filed: Nov. 14, 2019

(86) PCT No.: PCT/JP2019/044683
§ 371 (c)(1),
(2) Date: Jun. 18, 2021

(87) PCT Pub. No.: WO2020/137225
PCT Pub. Date: Jul. 2, 2020

(65) Prior Publication Data
US 2022/0073275 A1 Mar. 10, 2022

(30) Foreign Application Priority Data

Dec. 26, 2018 (JP) ................................ 2018-242936

(51) Int. Cl.
*H01L 21/677* (2006.01)
*B65G 1/04* (2006.01)
*B65G 1/06* (2006.01)

(52) U.S. Cl.
CPC .. *H01L 21/67733* (2013.01); *H01L 21/67727* (2013.01); *H01L 21/6773* (2013.01);
(Continued)

(58) Field of Classification Search
CPC ...... B65G 2201/0297; H01L 21/67727; H01L 21/6773; H01L 21/67733; H01L 21/67736; H01L 21/67769; Y10S 414/14
See application file for complete search history.

(56) References Cited

U.S. PATENT DOCUMENTS 6,332,744 B1    12/2001  Fukushima et al.
9,004,840 B2 *   4/2015  Kinugawa ......... H01L 21/67736
                                                        414/281
(Continued)

FOREIGN PATENT DOCUMENTS

JP    06-216102 A    8/1994
JP    11-191582 A    7/1999
(Continued)

OTHER PUBLICATIONS

Official Communication issued in International Patent Application No. PCT/JP2019/044683, dated Feb. 10, 2020.
(Continued)

*Primary Examiner* — James Keenan
(74) *Attorney, Agent, or Firm* — Keating & Bennett, LLP

(57) ABSTRACT

A storage system includes an overhead stocker including an overhead crane track, shelving in which tiers of storages to accommodate articles therein are arranged vertically, and a crane to travel along the overhead crane track and transfer an article between the tiers of storages, an overhead transport vehicle system to perform receiving or delivering of an article from or to a predetermined transfer destination, and a transporter to vertically transport an article between the overhead stocker and the overhead transport vehicle system, the overhead transport vehicle system being provided below a lower end of the overhead stocker.

7 Claims, 12 Drawing Sheets

(52) U.S. Cl.
CPC .. *H01L 21/67736* (2013.01); *H01L 21/67769* (2013.01); *B65G 1/0414* (2013.01); *B65G 1/0485* (2013.01); *B65G 1/065* (2013.01); *B65G 2201/0297* (2013.01)

(56) References Cited

U.S. PATENT DOCUMENTS

| | | | | |
|---|---|---|---|---|
| 9,168,930 | B2* | 10/2015 | Wada | H01L 21/67733 |
| 9,263,311 | B2* | 2/2016 | Ota | H01L 21/67736 |
| 9,520,313 | B2* | 12/2016 | Ota | H01L 21/67769 |
| 10,043,699 | B2* | 8/2018 | Li | H01L 21/6773 |
| 10,325,797 | B2* | 6/2019 | Iwasaki | H01L 21/67389 |
| 11,142,219 | B2* | 10/2021 | Takai | H01L 21/67736 |
| 11,239,102 | B2* | 2/2022 | Goto | H01L 21/67733 |
| 2003/0235486 | A1 | 12/2003 | Doherty et al. | |
| 2007/0081879 | A1* | 4/2007 | Bonora | H01L 21/67733 |
| | | | | 414/217 |
| 2014/0112741 | A1 | 4/2014 | Yoshioka et al. | |
| 2015/0003941 | A1 | 1/2015 | Takahara et al. | |
| 2016/0358799 | A1 | 12/2016 | Murata et al. | |
| 2018/0105361 | A1 | 4/2018 | Horii et al. | |
| 2018/0297779 | A1 | 10/2018 | Masuda et al. | |
| 2021/0078800 | A1 | 3/2021 | Ii et al. | |

FOREIGN PATENT DOCUMENTS

| | | |
|---|---|---|
| JP | 2007-022677 A | 2/2007 |
| JP | 2011-001149 A | 1/2011 |
| JP | 5700255 B2 | 4/2015 |
| JP | 2017-030944 A | 2/2017 |
| TW | 200827264 A | 7/2008 |
| WO | 2018/187208 A1 | 10/2018 |

OTHER PUBLICATIONS

Official Communication issued in corresponding Eurpoean Patent Application No. 19906439.5, dated Jul. 7, 2022.

* cited by examiner

STORAGE SYSTEM

BACKGROUND OF THE INVENTION

1. Field of the Invention

The present invention relates to a storage system.

2. Description of the Related Art

Overhead transport vehicles provided in an overhead traveling vehicle system are known to be used in semiconductor manufacturing factories to transport articles such as FOUPs for accommodating semiconductor wafers and reticle pods for accommodating reticles, and receive or deliver articles from or to transfer destinations such as a load port of a processing apparatus. Also, it has been proposed that articles be transported by means of overhead transport vehicles and placed in shelving provided on the ceiling of a building or the like for storing (for example, see Japanese Unexamined Patent Application, First Publication No. 2017-030944). Japanese Unexamined Patent Application, First Publication No. 2017-030944, discloses that articles are received or delivered from or to a storage of shelving, by means of an overhead transport vehicle that travels along an overhead track installed on a ceiling.

SUMMARY OF THE INVENTION

In Japanese Unexamined Patent Application, First Publication No. 2017-030944, shelving and an overhead transport vehicle are arranged so as to overlap with each other in a side view. The overhead track along which the overhead transport vehicle travels is arranged so as to travel, for example, directly above transfer destinations, corresponding to transfer destinations such as load ports. Therefore, as a result of installing the overhead track to align with the transfer destinations, there is a problem in that the shelving must be arranged in a space to avoid the overhead track, and consequently, expansion of the shelving in a horizontal direction becomes difficult. For example, there is a problem of inefficiency in storing articles in that, if the space between parallel overhead tracks is narrow, shelving cannot be provided therein, or an integer multiple number of shelves cannot be arranged in line in certain spaces between parallel overhead tracks.

Preferred embodiments of the present invention provide storage systems each capable of easily expanding shelving to store articles, in a horizontal direction.

A storage system according to an aspect of a preferred embodiment of the present invention is a storage system including an overhead stocker including an overhead crane track, shelving in which a plurality of tiers of storages to place articles therein are arranged vertically, and a crane to travel along the overhead crane track and transfer an article among the plurality of tiers of storages, an overhead transport vehicle system to perform receiving or delivering of an article from or to a predetermined transfer destination, and a transporter to vertically transport an article between the overhead stocker and the overhead transport vehicle system, the overhead transport vehicle system being provided below a lower end of the overhead stocker.

The storage system may include a receiving/delivering port to receive or deliver an article between the overhead transport vehicle system and the transporter. A plurality of the receiving/delivering ports may be provided.

The overhead transport vehicle system may include an overhead track below the lower end of the overhead stocker, and an overhead transport vehicle including a traveler to travel along the overhead track, a lift driver to raise or lower an article being held, and a lateral extender to move the lift driver laterally with respect to the traveler, the receiving/delivering port may be provided on a lateral side of and below the overhead track, and the overhead transport vehicle may be capable of receiving or delivering an article from or to the predetermined transfer destination by raising or lowering the article via the lift driver, and may be capable of receiving or delivering an article from or to the receiving/delivering port that is present below the lift driver having been moved by the lateral extender, by raising or lowering the article via the lift driver in the state where the lateral extender has moved the lift driver to above the receiving/delivering port.

The transporter may be a second overhead transport vehicle including a second traveler to travel on the overhead crane track, a second lift driver to raise or lower an article being held, and a second lateral extender to move the second lift driver laterally with respect to the second traveler, the receiving/delivering port may be provided below the second overhead transport vehicle, and the second overhead transport vehicle may be capable of receiving or delivering an article from or to the receiving/delivering port by raising or lowering the article via the second lift driver, and may be capable of receiving or delivering an article from or to the storage that is present below the second lift driver having been moved by the second lateral extender, by raising or lowering the article via the second lift driver in the state where the second lateral extender has moved the second lift driver to above at least one of the plurality of tiers of the storages.

The receiving/delivering port and the predetermined transfer destination may not be aligned as viewed in a plan view. A portion of the shelving and the predetermined transfer destination may overlap with each other as viewed in a plan view. The crane may include a crane traveler to travel on the overhead crane track and a transferer to transfer an article between the plurality of tiers of the storages, and the transferer may include a mast that extends in a vertical direction while being suspended from the crane traveler, an elevation platform to ascend or descends along the mast, a driver to raise or lower the elevation platform, an extender/retractor capable of extending from and retracting to the elevation platform, in a direction perpendicular or substantially perpendicular to a traveling direction of the crane traveler, and a holder that is provided at a distal end of the extender/retractor to hold an article.

According to a storage system of the above-described aspect of a preferred embodiment of the present invention, the overhead stocker and the overhead transport vehicle system do not overlap with each other in a side view. Therefore, even when the overhead track of the overhead transport vehicle system is installed so as to align with a predetermined transfer destination, shelving can be provided regardless of the arrangement of the overhead track, so that the shelving can easily be expanded in a horizontal direction, allowing a large number of articles to be stored efficiently. Since the crane transfers articles between the multiple tiers of storages, the articles can easily be transferred even when the shelving is expanded in a horizontal direction. The transporter can efficiently transport articles between the overhead stocker and the overhead transport vehicle system so as to improve the efficiency of transporting articles.

In a configuration provided with a receiving/delivering port to receive or deliver articles between the overhead transport vehicle system and the transporter, the overhead transport vehicle system or the transporter can start performing a subsequent operation as an article of the receiving/delivering target is placed on the receiving/delivering port, such that receiving or delivering of articles can be performed efficiently. In a configuration in which a plurality of receiving/delivering ports are provided, articles can be efficiently received or delivered between the overhead transport vehicle system and the transporter by placing the articles on the plurality of receiving/delivering ports.

In a configuration such that the overhead transport vehicle system includes an overhead track below the lower end of the overhead stocker, and an overhead transport vehicle including a traveler that travels on the overhead track, a lift driver, and a lateral extender, the receiving/delivering port is provided on a lateral side of and below the overhead track, and the overhead transport vehicle is capable of receiving or delivering an article from or to the predetermined transfer destination by raising or lowering the article via the lift driver, and is capable of receiving or delivering an article from or to the receiving/delivering port that is present below the lift driver having been moved by the lateral extender, by raising or lowering the article via the lift driver in the state where the lateral extender has moved the lift driver to above the receiving/delivering port, articles can be received from or delivered to the predetermined transfer destination or the receiving/delivering port quickly and accurately by using the overhead transport vehicle in the overhead transport vehicle system.

In a configuration such that the transporter is a second overhead transport vehicle including a second traveler that travels on the overhead crane track, a second lift driver, and a second lateral extender, the receiving/delivering port is provided below the second overhead transport vehicle, and the second overhead transport vehicle is capable of receiving or delivering an article from or to the receiving/delivering port by raising or lowering the article via the second lift driver, and is capable of receiving or delivering an article from or to the storage that is present below the second lift driver having been moved by the second lateral extender, by raising or lowering the article via the second lift driver in the state where the second lateral extender has moved the second lift driver to above at least one of the plurality of tiers of the storages, the second traveler of the second overhead transport vehicle travels on the overhead crane track, and it is therefore not necessary to separately provide a track for the traveler. By using such second overhead transport vehicle, articles can be received from or delivered to the predetermined transfer destination or the receiving/delivering port quickly and accurately.

In a configuration such that the receiving/delivering port and the predetermined transfer destination are not aligned as viewed in a plan view, the overhead track of the overhead transport vehicle system can be arranged directly above the predetermined transfer destination, such that an article can be received from or delivered to the predetermined transfer destination by the overhead transport vehicle raising or lowering the article. In a configuration such that a portion of the shelving and the predetermined transfer destination overlap with each other as viewed in a plan view, the shelving can be expanded horizontally to above the predetermined transfer destination, and a large number of articles can be stored in the storage of the shelving. In a configuration such that the crane includes the crane traveler and the transferer mentioned above, and the transferer includes the mast, the elevation platform, the driver, the extender/retractor, and the holder mentioned above, articles can be transferred efficiently between the multiple tiers of storages.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
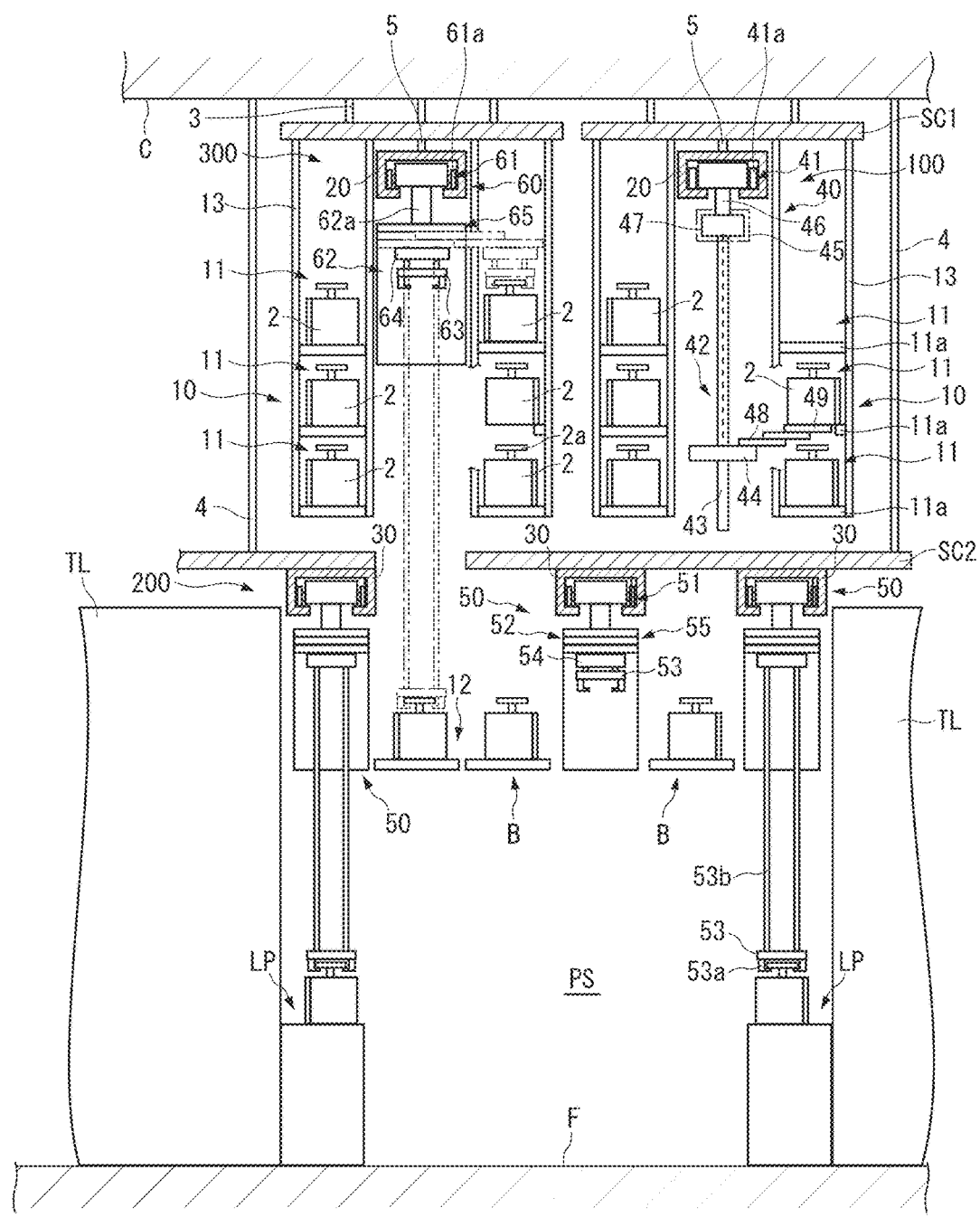
FIG. 1 is a diagram showing an example of a storage system according to a first preferred embodiment of the present invention, as viewed from the Y direction.

The following describes preferred embodiments of the present invention with reference to the drawings. However, the present invention is not limited to the preferred embodiments. In the drawings, scale is changed as necessary to illustrate the preferred embodiments, such as by enlarging or by emphasizing a part. In the following drawings, an XYZ coordinate system is used to describe the directions in each drawing. In this XYZ coordinate system, the vertical direction is taken as the Z direction, and the horizontal directions are taken as the X direction and the Y direction. The Y direction is one direction in the horizontal direction, and is the traveling direction of a crane 40, an overhead transport vehicle 50, and a second overhead transport vehicle 60, which will be described later. The X direction is a direction perpendicular or substantially perpendicular to the Y direction. Also, in each of the X, Y, and Z directions, where appropriate, the orientation indicated by the arrow is expressed as a positive (+) direction (for example, +X direction), and the direction opposite thereof is expressed as a negative (−) direction (for example, −X direction).

First Preferred Embodiment

Figure 2:
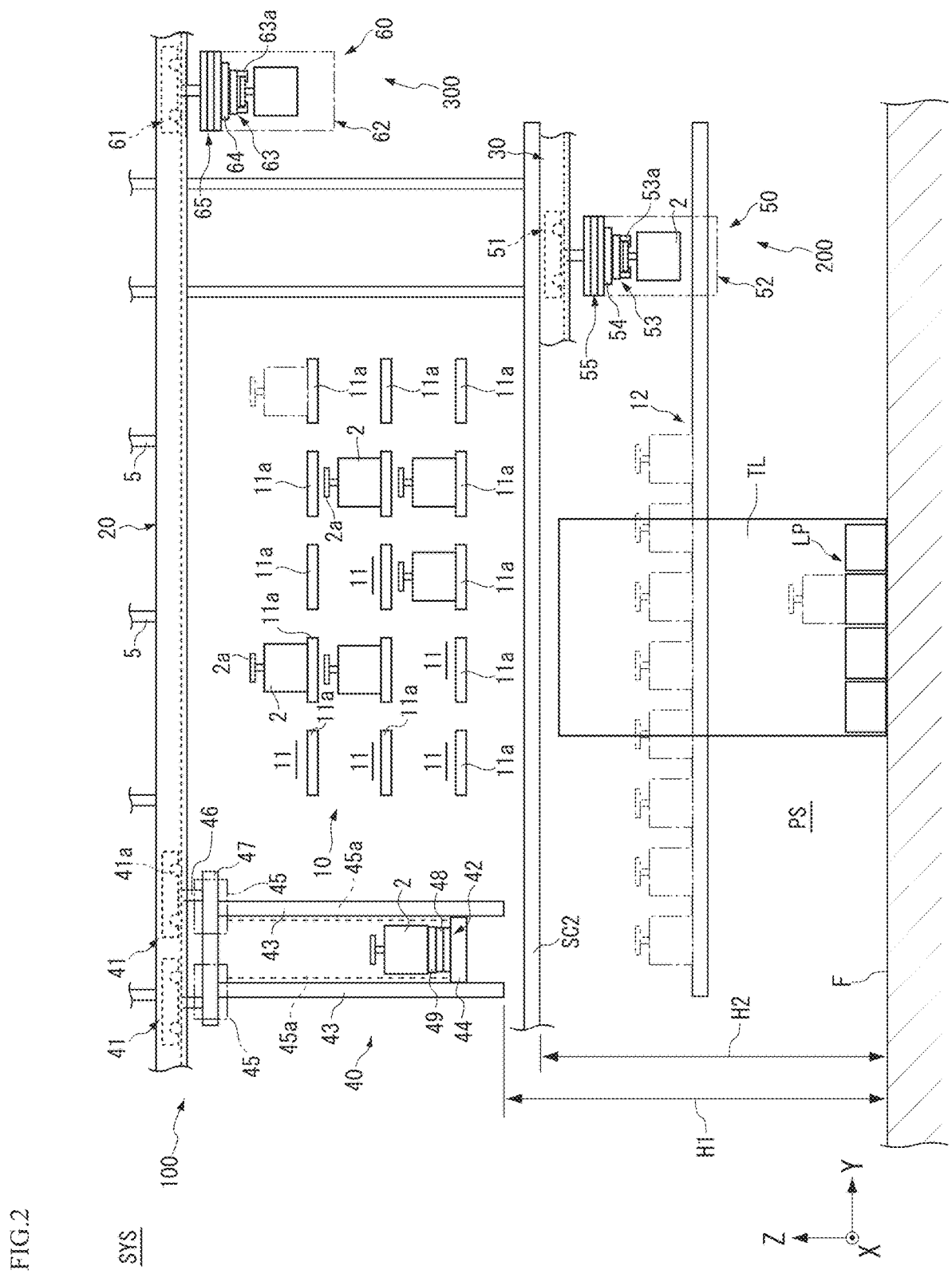
FIG. 2 is a diagram showing an example of the storage system shown in FIG. 1, as viewed from the Y direction.
Figure 3:
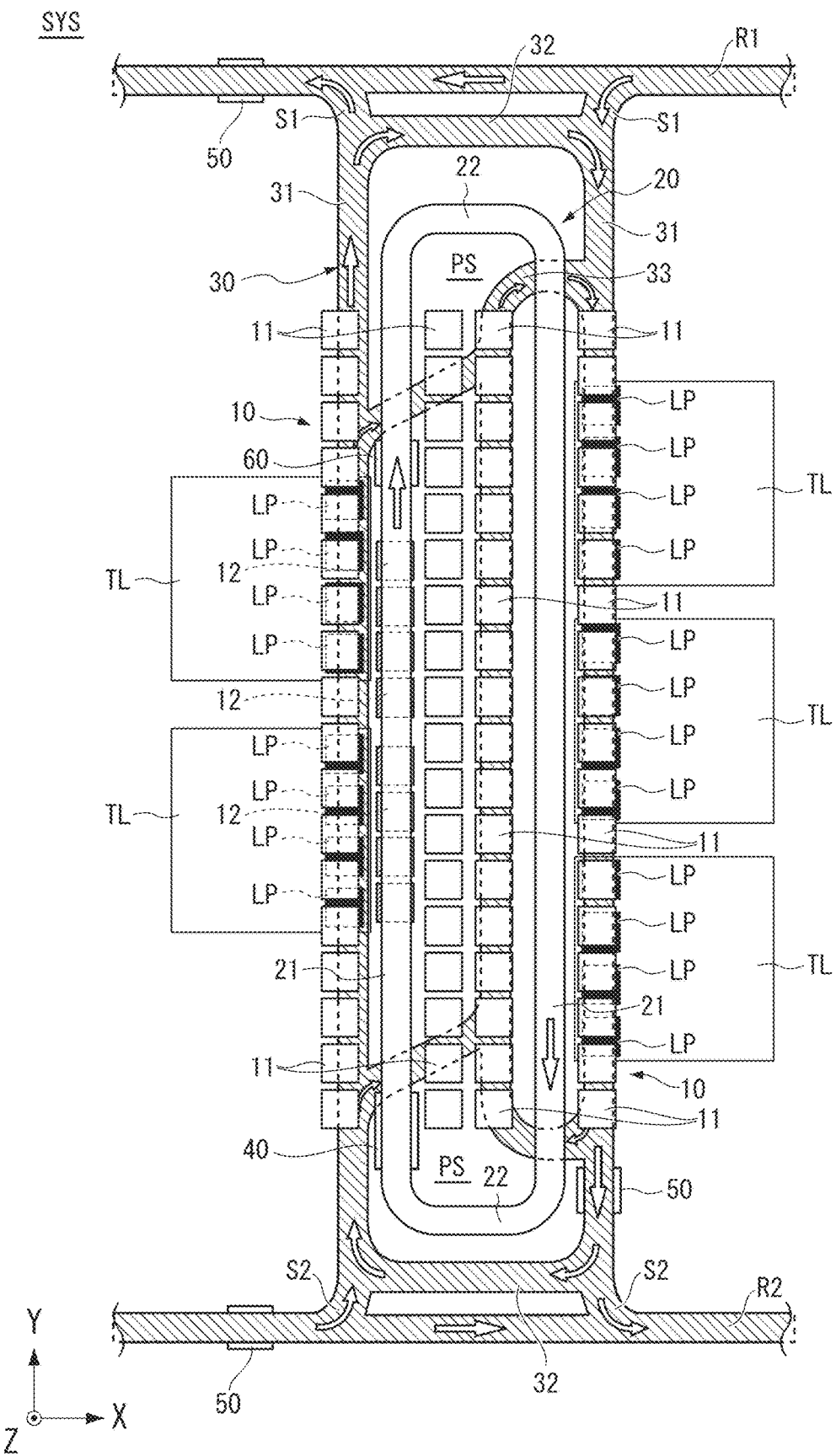
FIG. 3 is a diagram schematically showing the storage system in a plan view.

FIG. 1 is a diagram showing an example of a storage system SYS according to a first preferred embodiment, as viewed from the Y direction. FIG. 2 is a diagram showing the storage system SYS as viewed from the X direction. FIG. 3 is a diagram schematically showing the storage system SYS as viewed in a plan view. In FIG. 3, in order to facilitate drawing distinctions in the figure, an overhead crane track 20 and storages 11 of an overhead stocker 100 are shown in white, an overhead track 30 and receiving/delivering ports 12 of an overhead transport vehicle system 200 are shown with hatched lines, and load ports LP of a processing apparatuses TL are shown in black.

The storage system SYS shown in FIG. 1 to FIG. 3 is installed in a semiconductor device manufacturing factory or the like, and stores articles 2 such as FOUPs accommodating semiconductor wafers or reticle pods accommodating processing members such as reticles, which are used for manufacturing semiconductor devices. In the present preferred embodiment, an example is described in which the articles 2 are FOUPs, but the articles 2 may be other types of articles other than FOUPs. The storage system SYS can also be applied to facilities of other fields other than the semiconductor field, and the articles 2 may be another type of articles that can be stored in the storage system SYS.

As shown in FIG. 1 to FIG. 3, the storage system SYS includes an overhead stocker 100, an overhead transport vehicle system 200, and a transporter 300. The overhead stocker 100 includes shelving 10 including a plurality of storages 11, an overhead crane track 20, and a crane 40. The shelving 10 is arranged on the inner side and on the outer side of the overhead crane track 20, on which the crane 40 travels (see FIG. 3). As shown in FIG. 1, the plurality of storages 11 provided in the shelving 10 are held by a frame 13 and are arranged in three tiers in the vertical direction (the Z direction). The number of tiers of the storages 11 can be set arbitrarily. The plurality of storages 11 are arranged in line along the traveling direction (the Y direction) of the crane 40, which will be described later. In the present preferred embodiment, the storage 11 is a space to place and store an article 2 therein or a storage space. That is to say, the storage 11 is a storage space for an article 2 in which a surface on which to place an article 2 thereon (for example, the upper surface of a shelf board 11a) and the space between this surface and the ceiling or the like thereof (for example, the lower surface of the shelf board 11a) are combined.

The plurality of storages 11 each include the shelf board 11a, on which an article 2 is placed. In the following description, placing an article 2 in the storages 11 includes placing the article 2 on the shelf board 11a of the storage 11. On the shelf board 11a of the storage 11, there may be provided a plurality of pins that enter grooves provided on the bottom surface of the article 2 when the article 2 is placed on the shelf board 11a. When these pins enter the grooves of the article 2, the article 2 is positioned with respect to the storage 11.

The shelving 10 is suspended from a system ceiling SC1 via the frame 13. The system ceiling SC1 is suspended from a ceiling C of the building via metal hangers 3. The frame 13 may be suspended directly from the ceiling C instead of being suspended from the system ceiling SC1. A lower end of the shelving 10 is set higher than the height of the processing apparatus TL from the floor surface F. The processing apparatus TL performs various processes such as a film formation process or an etching process on semiconductor wafers accommodated in a FOUP, which is an article 2, for example. The height of a lower end of the crane 40 described later is also set higher than the height of the processing apparatus TL. That is to say, the overhead stocker 100 is arranged above the processing apparatus TL. The lower end of the crane 40 is set to a height with which operators can walk on the floor surface F with no hindrance. As a result, a portion of the space below the overhead stocker 100 can be used as an operator passage PS.

The crane 40 places an article 2 in the storage 11 and takes an article 2 therefrom. The second overhead transport vehicle 60 described later also places an article 2 in the storage 11 and takes an article 2 therefrom. The storage 11 from or to which the second overhead transport vehicle 60 receives or delivers an article 2 is the storage 11 on the uppermost tier of the shelving 10. The vertical dimension of the storage 11 is a dimension required for a transferer 42 of the crane 40, which will be described later, to lift an article 2. The transferer 42 of the crane 40 includes, for example, a configuration to support and lift an article 2 from the lower surface side, and does not require a large space above the article 2. For example, the vertical dimension of the storage 11 can be set to a dimension that would add several centimeters to the vertical dimension of the article 2.

As shown in FIG. 1, the overhead crane track 20 is suspended from the system ceiling SC1 via metal hangers 5. The overhead crane track 20 may be suspended directly from the ceiling C instead of being suspended from the system ceiling SC1. As shown in FIG. 3, the overhead crane track 20 is an annular track that includes linear portions 21 extending in the Y direction and turning portions 22. The overhead crane track 20 being an annular track enables the shelving 10 to be installed on both sides in the X direction with respect to the two linear portions 21 in a plan view. As shown in FIG. 1, the overhead crane track 20 is higher from the floor surface F than the overhead track 30 of the overhead transport vehicle system 200.

The crane 40 travels on the overhead crane track 20 to hold and move an article 2. The crane 40 transfers the article 2 between a storage 11 and another storage 11. The crane 40 circulates and travels on the overhead crane track 20. The number of cranes 40 provided on a single overhead crane track 20 is not limited to one. For example, two or more cranes 40 may be provided on a single overhead crane track 20. As shown in FIG. 1 and FIG. 2, the crane 40 is suspended from the overhead crane track 20.

Figure 4:
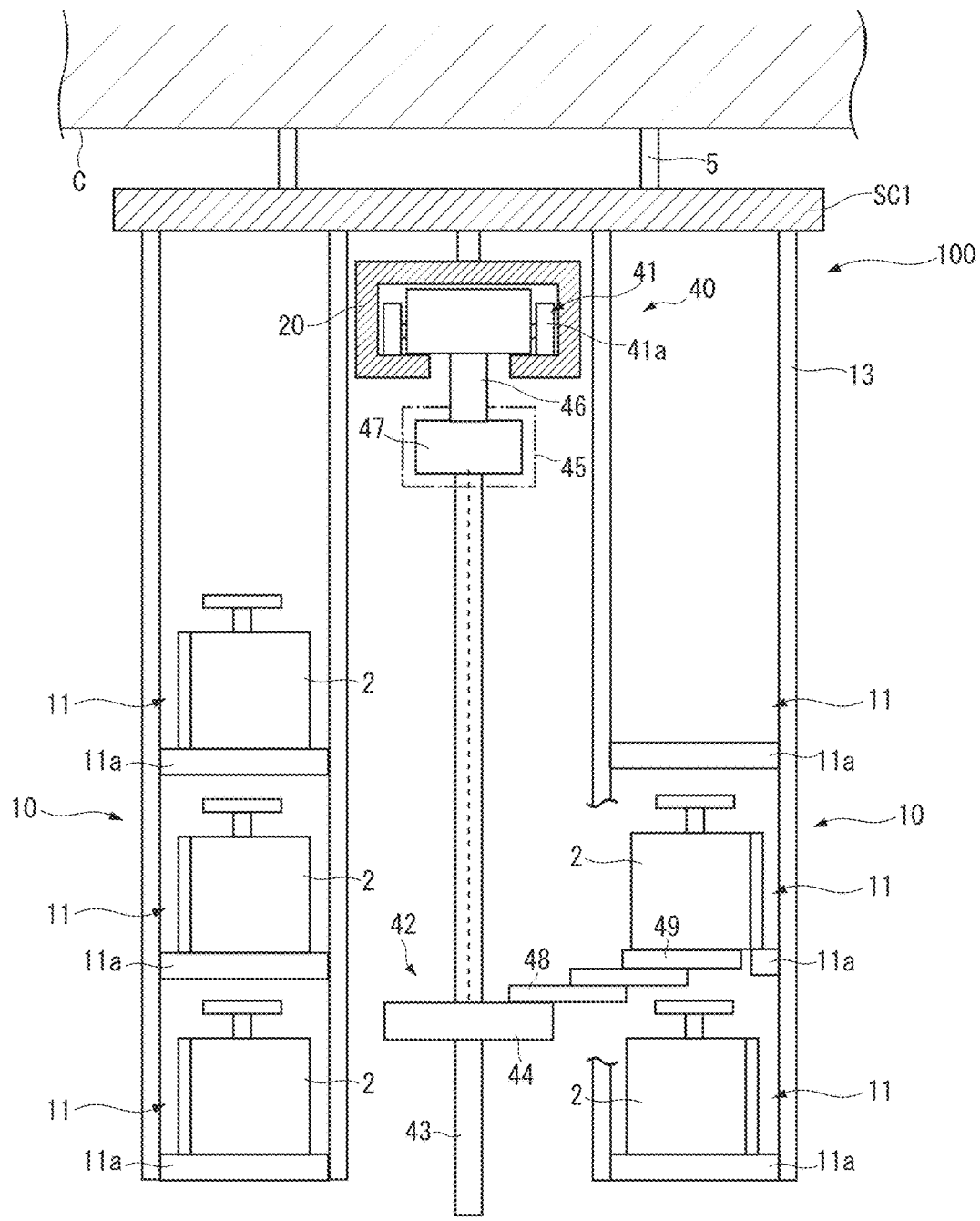
FIG. 4 is a diagram showing an example of a crane of an overhead stocker.

FIG. 4 is a diagram showing an example of the crane 40. The crane 40 travels on the overhead crane track 20 installed on the ceiling side, and it is, therefore, not necessary to provide a track on the floor surface F side (the ground side). The crane 40 includes two crane travelers 41 (see FIG. 2) and a transferer 42. An upper support 47 is attached to the lower side of the crane traveler 41 via an connector 46, and two crane travelers 41 are connected by the upper support 47. Each crane traveler 41 includes a traveling driver not shown in the drawings and a plurality of wheels 41a, and travels along the overhead crane track 20. The traveling driver may be, for example, an electric motor which is provided in the crane traveler 41 to drive the wheels 41a, or may be a linear motor which is provided using the overhead crane track 20.

In the crane 40 of the present preferred embodiment, the transferer 42 and the article 2, which are heavy objects, can be reliably supported by using two crane travelers 41. The crane 40 uses two crane travelers 41, however, it is not limited to this configuration, and one, or three or more crane travelers 41 may be used.

The transferer 42 includes masts 43, an elevation platform 44, drivers 45, an extender/retractor 48, and a placement platform 49. Each mast 43 extends in the vertical direction while being suspended from the upper support 47 (the crane traveler 41), and one mast 43 is provided at front and at rear respectively in the traveling direction of the crane traveler 41 (see FIG. 2). Each mast 43 preferably has a hollow or solid rod shape, and the cross section thereof preferably has a circular shape, an elliptical shape, an oval shape, or a polygonal shape such as a quadrangular shape. For attachment of the masts 43 to the upper support 47, fastening members such as bolts and nuts may be used or welding or the like may be used, for example. The total number of masts 43 is not limited to two, and may be one. As mentioned above, the height of the lower end of the mast 43 from the floor surface F is set higher than the height of the processing apparatus TL. For example, the lower end of the mast 43 is the lower end of the crane 40.

The extender/retractor includes a plurality of arms capable of extending and retracting in a direction perpendicular or substantially perpendicular to the traveling direction of the crane traveler 41. The placement platform 49 is provided at a distal end of the extender/retractor 48. The placement platform 49 is a triangular plate on which an article 2 can be placed. The placement platform 49 is a holder that holds the article 2 by placing the article 2 thereon. On the upper surface of the placement platform 49, there is provided a pin that is to be inserted into a groove provided on the bottom surface of the article 2 to position the article 2. The shelf board 11a mentioned above is provided with a cutout (not shown in the drawings) through which the placement platform 49 can pass in the vertical direction.

When receiving an article 2 from the storage 11, the transferer 42 raises the elevation platform 44 in a state where the extender/retractor 48 is extended and the placement platform 49 is positioned below the article 2, to pick up the article 2 with the placement platform 49. The transferer 42 positions the placement platform 49 with the article 2 placed thereon above the elevation platform 44, by retracting the extender/retractor 48 while the article 2 is placed on the placement platform 49. Delivering of the article 2 to the storage 11 via the transferer 42 is performed by performing the above operations in a reversed manner. The transferer 42 is not limited to the above configuration, and may be of another configuration such as one in which a portion of an article 2 (for example, a flange 2a provided on the upper portion of a FOUP defining and functioning as the article 2) is held and raised.

The drivers 45 raise or lower the elevation platform 44 along the masts 43, using a hoist or the like for example. Each driver 45 includes a suspender 45a and a driving unit not shown in the drawings. The suspenders 45a are belts or wires, and the elevation platform 44 is suspended from the upper support 47 by the suspenders 45a. The driving unit not shown in the drawings is provided on the upper support 47 and feeds out or winds up the suspenders 45a. When the driving unit feeds out the suspenders, the elevation platform 44 is lowered by being guided by the masts 43. When the driving unit winds up the suspenders 45a, the elevation platform 44 is raised, being guided by the masts 43. The drivers 45 are controlled by a controller or the like not shown in the drawings to lower or raise the elevation platform 44 at a predetermined speed. The drivers 45 are controlled by the controller or the like to maintain the elevation platform 44 at a target height.

As shown in FIG. 4, the drivers 45 are provided on the upper support 47 (the crane traveler 41). The drivers 45 may be provided, for example, on the elevation platform 44 instead of being provided on the upper support 47. As a configuration of providing the drivers 45 on the elevation platform 44, the elevation platform 44 may be raised or lowered by winding up or feeding out the belts or wires suspended from the upper support 47, via a hoist or the like mounted on the elevation platform 44, for example. Also, the elevation platform 44 may be raised or lowered by mounting an electric motor or the like that drives a pinion gear, defining a rack that meshes with the pinion gear, on the masts 43, and driving the electric motor and so forth to rotate the pinion gear.

The overhead transport vehicle system 200 includes the overhead transport vehicle 50 that travels along the overhead track 30, and that receives or delivers articles 2 from or to the load port LP of the processing apparatus TL, which is a predetermined transfer destination arranged below the overhead track 30. As shown in FIG. 1, the overhead track 30 is attached to the lower face side of the system ceiling SC2. The system ceiling SC2 is suspended from the ceiling C via metal hangers 4. The overhead track 30 may be suspended from a system ceiling SC1 or from the ceiling C instead of being suspended from the system ceiling SC2.

The overhead track 30 is located between an inter-bay route (inter-bay track) R1 and an inter-bay route R2 in a plan view. The overhead track 30 is an intra-bay route provided in each bay (in each intra-bay), and the inter-bay route R1 or the like is provided to connect a plurality of overhead tracks 30 defining and functioning as intra-bay routes, to each other. The overhead track 30 is connected from the inter-bay route R1 via two branch tracks S1 used to enter or exit, and is connected from the inter-bay route R2 via two branch tracks S2 used to enter or exit.

The overhead track 30 includes linear portions 31, turning portions 32, and branching portions 33. The overhead transport vehicle 50 can travel to circulate in one direction (for example, in the clockwise direction in a plan view) along the linear portions 31 and the turning portions 32. The linear portions 31 are arranged, directly above the load ports LP, in the Y direction along the plurality of load ports LP. The two linear portions 31 are parallel or substantially parallel to the linear portions 21 of the overhead crane track 20 in a plan view. The turning portion 32 is arranged at both the +Y side end and at the −Y side end and includes curved portions, connecting the two linear portions 31 to each other. The branching portion 33 is arranged on the inner side in a plan view on the overhead track 30, which is a circular track, and connects the two linear portions 31 to each other (see FIG. 3). A buffer B, in which an article 2 can be placed, is provided on the +X side and on the −X side of the branching portion 33 (see FIG. 1). The branching portion 33 and the buffer B need not be provided.

The overhead track 30 is arranged below the lower end (the lower end of the overhead stocker 100) of the crane 40 (the mast 43). The lower end of the crane 40 is set at a height H1 from the floor surface F, and the upper end of the overhead track 30 is set at a height H2 from the floor surface F (see FIG. 2). The height H2 is set lower than the height H1, and as a result, the overhead track 30 is located below the lower end of the overhead stocker 100. The overhead transport vehicle 50 that travels on the overhead track 30 travels below the lower end of the overhead stocker 100. With this configuration, the overhead stocker 100 and the overhead transport vehicle 50 of the overhead transport vehicle system 200 do not overlap with each other in a side view.

The overhead transport vehicle 50 enters the overhead track 30 from the inter-bay route R1 or R2 via the branch track S1 or S2, or exits the overhead track 30 to the inter-bay route R1 or R2 via the branch track S1 or S2. The overhead transport vehicle 50 travels along the overhead track 30, and transfers articles 2 between the load ports LP of the processing apparatus TL and the receiving/delivering ports 12, which will be described later, on the linear portion 31.

The linear portion 31 of the overhead track 30 extends directly above the plurality of load ports LP facing each other across a predetermined clearance (the operator passage PS). In the present preferred embodiment, the load ports LP are provided at four locations on one processing apparatus TL (see FIG. 3), however, the configuration is not limited to this example. For example, load ports LP may be provided at one to three locations on one processing apparatus TL, or may be provided at five or more locations. Since the overhead track 30 extends directly above the load ports LP, the article 2 can be received from or delivered to the load port LP simply by the overhead transport vehicle 50 on the overhead track 30 raising and lowering the article 2. The overhead transport vehicle 50 on the overhead track 30 can receive or deliver the article 2 from or to the receiving/delivering port 12 by laterally extending the gripper 53 to the receiving/delivering port 12 (by a lateral transfer operation).

As shown in FIG. 1 and FIG. 2, the overhead transport vehicle 50 includes a traveler 51 and a main body 52. The main body 52 includes the gripper 53 that holds an article 2, a lift driver 54 that raises or lowers the article 2 being held, and a lateral extender 55 that laterally moves the lift driver 54 relative to the traveler 51. The traveler 51 includes a traveling driver not shown in the drawings and a plurality of wheels 51a, and travels along the overhead track 30. The traveling driver may be, for example, an electric motor that is provided in the traveler 51 to drive the wheels 51a, or may be a linear motor that is provided using the overhead track 30.

The main body 52 is attached to the lower portion of the traveler 51 via an connector 52a. The main body 52 includes a gripper 53 that holds an article 2, the lift driver 54 that suspends and raises or lowers the gripper 53, and a lateral extender 55 that moves the lift driver 54 to a lateral side of the track. The gripper 53 grips the flange 2a of an article 2 from above, to suspend and hold the article 2. The gripper 53 is, for example, a chuck including claws 53a capable of moving forward and backward in the horizontal direction, and it inserts the claws 53a under the flange 2a of the article 2 and raises the gripper 53 to suspend and hold the article 2. The gripper 53 is connected to suspenders 53b such as wires and belts. The gripper 53 ascends or descends while being suspended from the lift driver 54.

The lift driver 54 is, for example, a hoist, and lowers the gripper 53 by feeding out the suspenders 53b and raises the gripper 53 by winding up the suspenders 53b. The lift driver 54 is controlled by a controller or the like not shown in the drawings to lower or raise the gripper 53 at a predetermined speed. Also, the lift driver 54 is controlled by the controller to maintain the gripper 53 at a target height.

The lateral extender 55 includes movable plates stacked in the vertical direction, for example. The movable plates are movable to a lateral side of the traveling direction of the traveler 51 (in a direction perpendicular or substantially perpendicular to the traveling direction, or in a lateral direction). The lift driver 54 is attached to the movable plates. The main body 52 includes a guide not shown in the drawings that guides the lateral extender 55, and a driving unit not shown in the drawings that drives the lateral extender 55. The lateral extender 55 moves the lift driver 54 and the gripper 53 between a projecting position and a storing position, via the driving force of a driver such as an electric motor. The projecting position is a position at which the gripper 53 is projected to the lateral side from the main body 52. The storing position is a position at which the gripper 53 is stored in the main body 52. A rotating mechanism to rotate the lift driver 54 (the gripper 53) about an axis along the vertical direction between the lift driver 54 and the gripper 53.

The overhead transport vehicle 50 can receive or deliver an article 2 from or to the load port LP by the lift driver 54 raising or lowering the article 2. The overhead transport vehicle 50 can also receive or deliver an article 2 from or to the receiving/delivering port 12 that is present below the lift driver 54 having been moved by the lateral extender 55, by raising or lowering the article 2 via the lift driver 54 in the state where the lateral extender 55 has moved the lift driver 54 to above any one of the plurality of receiving/delivering ports 12.

A transporter 300 vertically transports an article 2 between the overhead stocker 100 and the overhead transport vehicle system 200. In the present preferred embodiment, the transporter 300 is a second overhead transport vehicle 60. The storage system SYS includes a receiving/delivering port 12 to receive or deliver an article 2 between the overhead transport vehicle system 200 and the transporter 300 (the second overhead transport vehicle 60). The receiving/delivering port 12 is arranged at a plurality of locations below the linear portion 21 of the overhead crane track 20 on which the second overhead transport vehicle 60 travels. The receiving/delivering ports are provided on a lateral side of and below the overhead track 30. As a result, as described above, the overhead transport vehicle 50 can receive or deliver an article 2 from or to the receiving/delivering port 12 through a lateral transfer operation).

Figure 5:
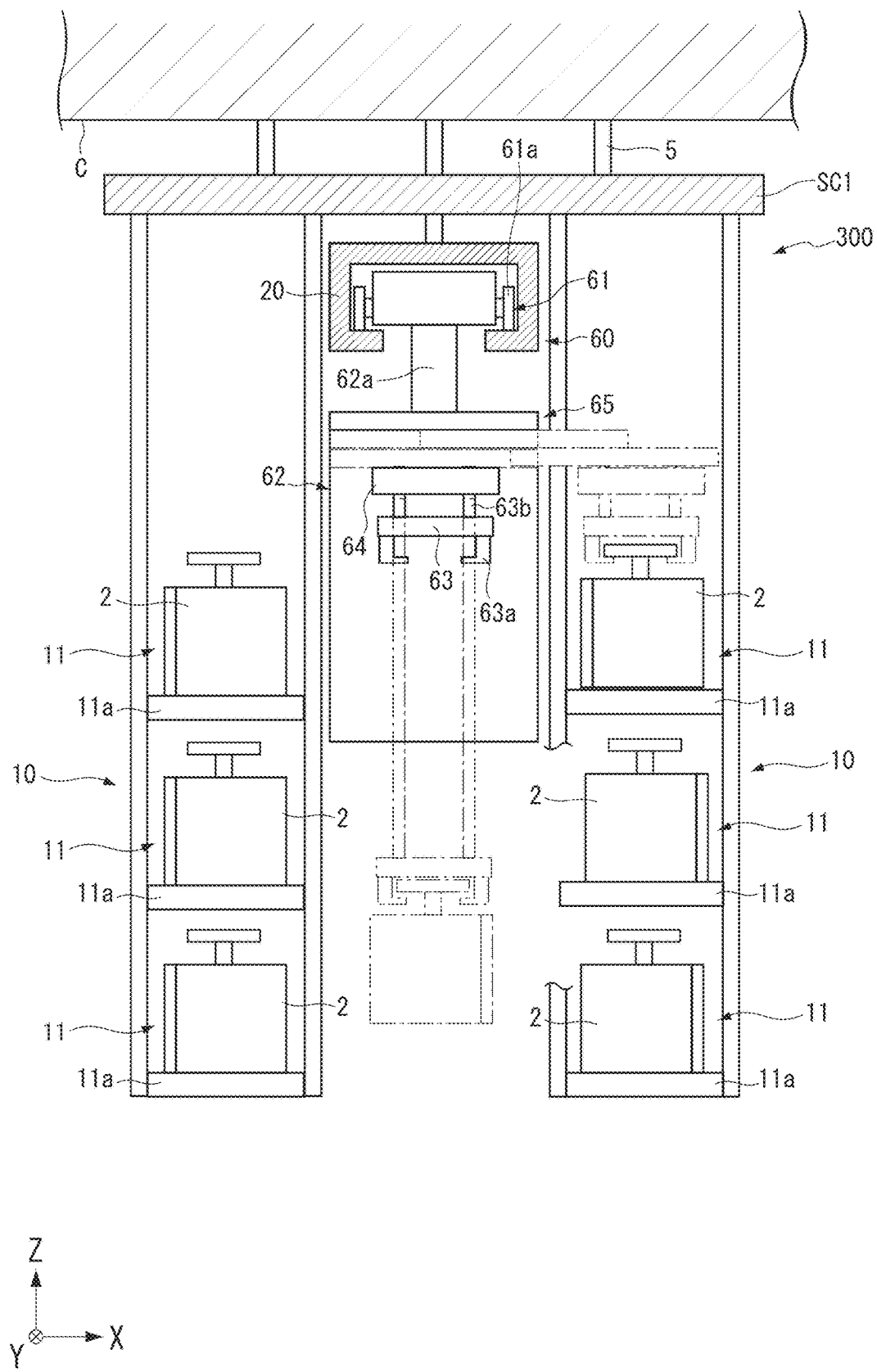
FIG. 5 is a diagram showing an example of a second overhead transport vehicle defining and functioning as a transporter.

The second overhead transport vehicle 60 vertically transports articles 2 between the overhead stocker 100 and the receiving/delivering port 12. FIG. 5 is a diagram showing an example of the second overhead transport vehicle 60. The second overhead transport vehicle 60 includes a second traveler 61 and a second main body 62. The second traveler 61 has a configuration similar to that of the crane traveler 41 of the crane applied thereto, and it includes a traveling driver not shown in the drawings and a plurality of wheels 61a, and travels along the overhead crane track 20.

The second main body 62 is attached to the lower portion of the second traveler 61 via an connector 62a. The second main body 62 includes a second gripper 63 that holds an article 2, a second lift driver 64 that raises or lowers the second gripper 63, and a second lateral extender 65 that moves the second lift driver 64 to a lateral side of the track. The second gripper 63 is, for example, a chuck including claws 63a and is connected to suspenders 63b.

The second lift driver 64 is, for example, a hoist, and raises or lowers the second gripper 63 by feeding out or winding up the suspenders 63b. The second lateral extender 65 moves the second lift driver 64 and the second gripper 63 between a projecting position and a storing position. The projecting position is a position at which the second gripper 63 projects to the lateral side from the second main body 62. The storing position is a position at which the second gripper 63 is stored in the second main body 62. Between the second lateral extender 65 and the second lift driver 64, there may be provided a rotating mechanism to rotate the second lift driver 64 (the second gripper 63) about an axis along the vertical direction.

The second traveler 61, the second main body 62, the second gripper 63, the second lift driver 64, and the second lateral extender 65 have configurations similar to those of the traveler 51, the main body 52, and the gripper 53, the lift driver 54, and the lateral extender 55 of the above overhead transport vehicle 50 applied thereto. Therefore, the overhead transport vehicle 50 of the overhead transport vehicle system 200 can be applied to the second overhead transport vehicle 60 in an unchanged manner. Since the second overhead transport vehicle 60 travels on the overhead crane track 20, it is not necessary to provide a separate track, and the manufacturing cost of the storage system SYS can be reduced.

The second overhead transport vehicle 60 can receive or deliver an article 2 from or to the receiving/delivering port 12 by the second lift driver 64 raising or lowering the article 2. Also, the second overhead transport vehicle 60 can receive or deliver an article 2 from or to the storage 11 that is present below the second lift driver 64 having been moved by the second lateral extender 65, by raising or lowering the article 2 via the second lift driver 64 in the state where the second lateral extender 65 has moved the second lift driver 64 to above at least one of the plurality of tiers of the storages 11. In the present preferred embodiment, an article 2 can be received from or delivered to the uppermost tier storage 11 of the shelving 10. The storage 11 from or to which the second overhead transport vehicle 60 receives or delivers the article 2 may be a storage 11 other than the one on the uppermost tier.

Figure 6:
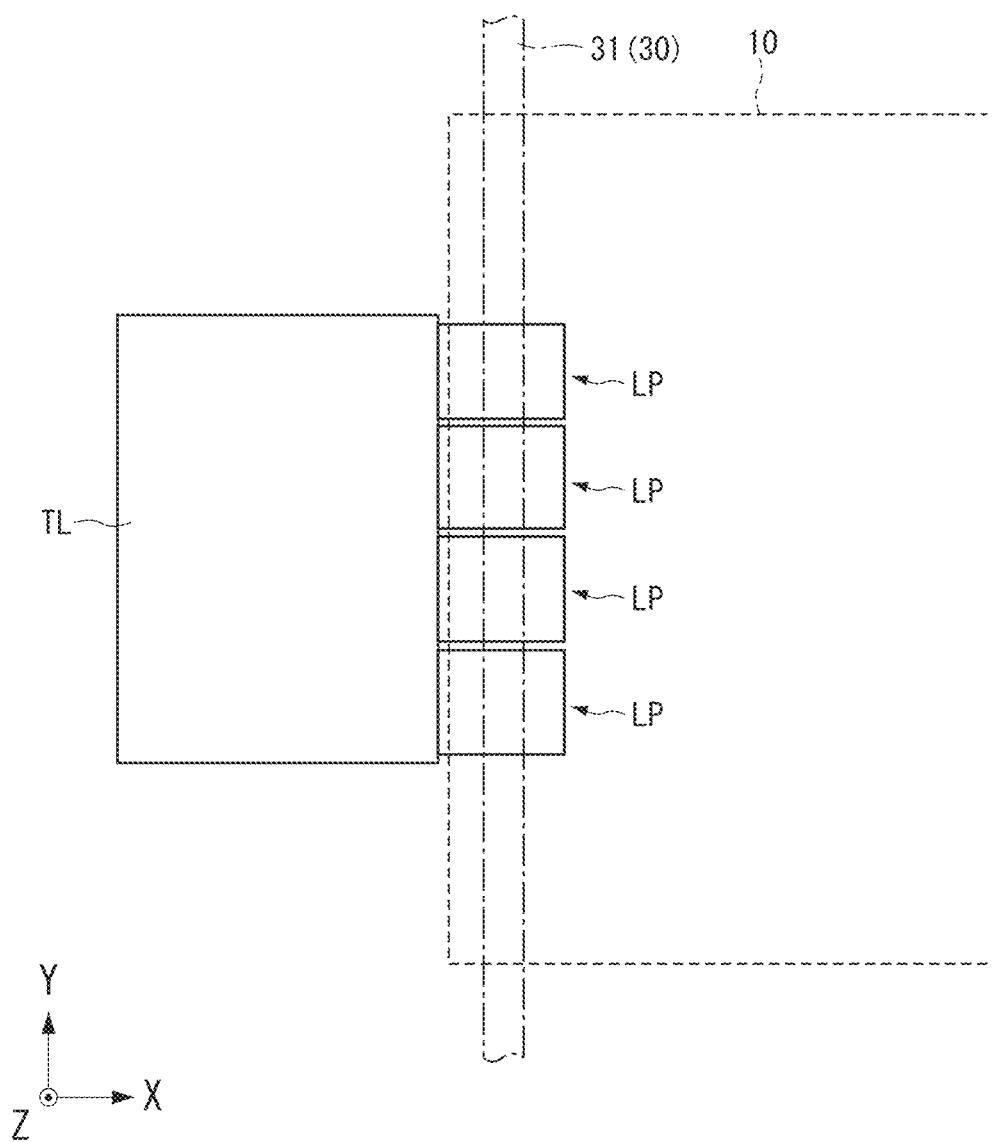
FIG. 6 is a diagram showing an enlarged view of a portion of FIG. 3.

FIG. 6 is a diagram showing an enlarged view of a portion of FIG. 3, and shows an example of the positional relationship between the shelving 10 of the overhead stocker 100 and the load ports LP. As shown in FIG. 6, in the present preferred embodiment, a portion of the shelving 10 overlaps with the load ports LP of the processing apparatus TL defining and functioning as a predetermined transfer destination as viewed in a plan view. Therefore, the shelving 10 can be expanded in the horizontal direction to above the load ports LP to store a large number of articles 2. The shelving 10 also overlaps with the overhead track 30 of the overhead transport vehicle system 200 in a plan view. That is to say, the shelving 10 can be provided regardless of the arrangement of the overhead track 30 of the overhead transport vehicle system 200. As a result, a high degree of freedom can be achieved in the arrangement of the shelving 10, and it is possible to easily realize an arrangement of the shelving 10 to accommodate articles 2 in a highly efficient manner.

Figure 7:
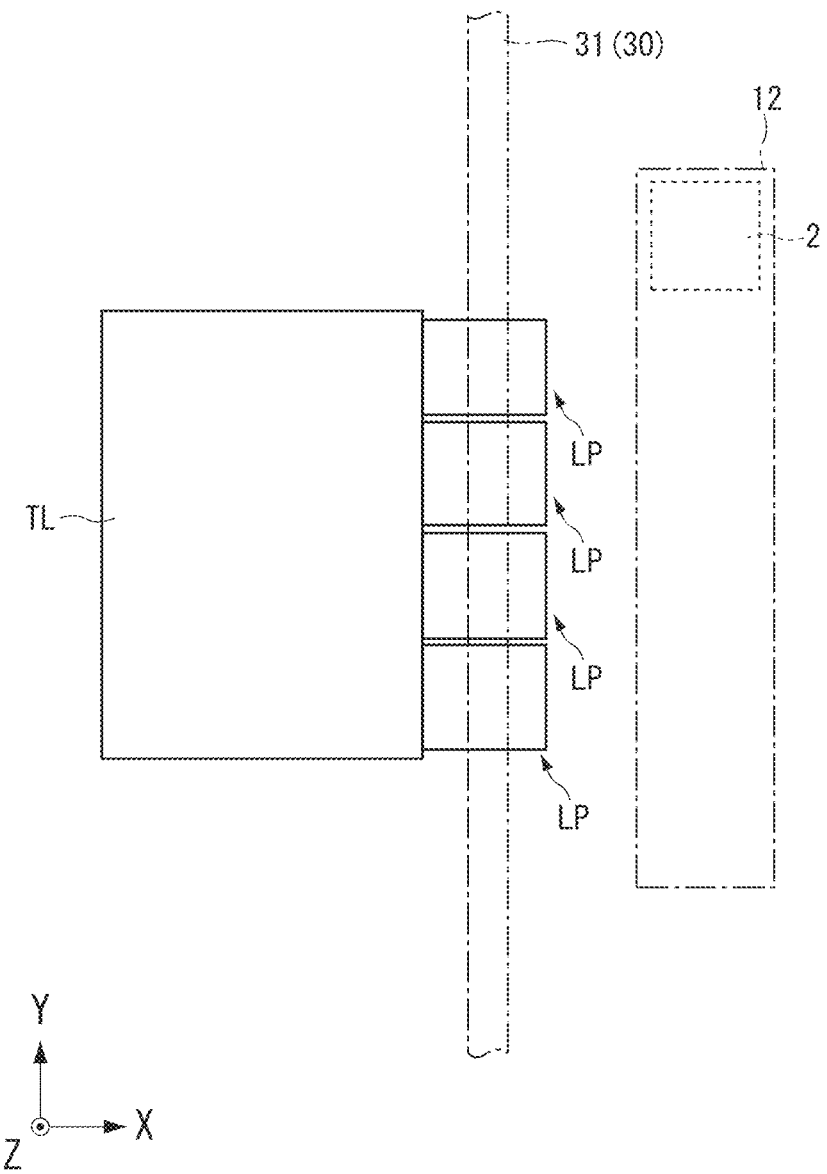
FIG. 7 is a diagram showing an enlarged view of a portion of FIG. 3.

FIG. 7 is a diagram showing an enlarged view of a portion of FIG. 3, and shows an example of the positional relationship between the receiving/delivering port 12 and the load ports LP. In FIG. 7, in order to facilitate drawing distinctions in the figure, the configuration on the overhead stocker 100 side is omitted. As shown in FIG. 7, the receiving/delivering port 12 and the load ports LP are arranged so as not to overlap with each other in a plan view. That is to say, the receiving/delivering port 12 and the overhead track 30 of the overhead transport vehicle system 200 directly above the load ports LP are arranged so as to be spaced apart from each other in a plan view (so as not to overlap with each other in the plan view).

As a result, when the second overhead transport vehicle 60 receives or delivers an article 2 from or to the receiving/delivering port 12, it is possible to avoid interference with the overhead track 30 or with the overhead transport vehicle 50 traveling on the overhead track 30. Also, when the second overhead transport vehicle 60 receives or delivers an article 2 from or to the receiving/delivering port 12, the overhead transport vehicle 50 is still allowed to travel, and it is therefore possible to avoid reduction in the efficiency of the overhead transport vehicle system 200 transporting articles 2.

The storage system SYS includes a controller not shown in the drawings. This controller controls the storage system SYS in a comprehensive manner. The controller controls operations of the crane 40, the overhead transport vehicle 50, and the second overhead transport vehicle 60 via wireless or wired communication. The controller may be divided into a controller that controls the crane 40, a controller that controls the overhead transport vehicle 50, and a controller that controls the second overhead transport vehicle 60.

FIG. 8 to FIG. 11 are diagrams showing an example of operations performed when an article 2 is transported from the storage unit 11 to the load port LP in the storage system SYS. The controller not shown in the drawings controls the second overhead transport vehicle 60 (the transporter 300) to receive the transport target article 2 from the uppermost tier storage 11 and then to deliver the article 2 to the specified receiving/delivering port 12. First, when the transport target article 2 is in a storage 11 other than the one on the uppermost tier, the crane 40 of the overhead stocker 100 transfers the article 2 to the uppermost tier storage 11 in the shelving 10.

Figure 8:
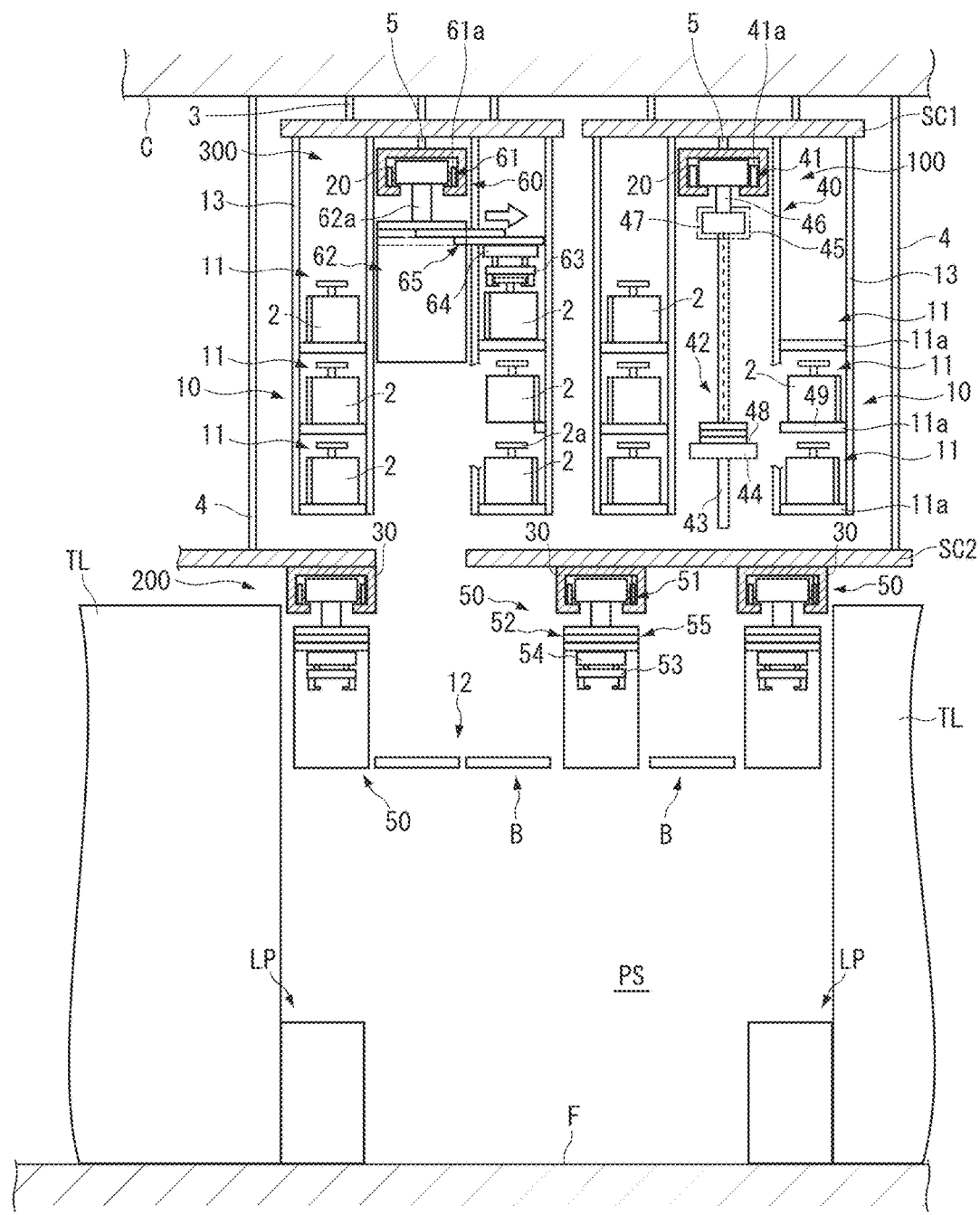
FIG. 8 is a diagram showing an operation of receiving an article from a storage, being performed by a transporter.

Next, as shown in FIG. 8, after having traveled along the overhead crane track 20, stopped at a side of the storage 11 in which the transport target article 2 is placed, and caused the second lift driver 64 to project via the second lateral extender 65, the second overhead transport vehicle 60 lowers the second gripper 63 via the second lift driver 64, and grips the article 2 via the second gripper 63. Next, after having raised the second gripper 63 via the second lift driver 64, the second overhead transport vehicle 60 retracts the second lateral extender 65 and returns the second gripper 63 to the storing position, to accommodate the article 2 in the second main body 62.

Figure 9:
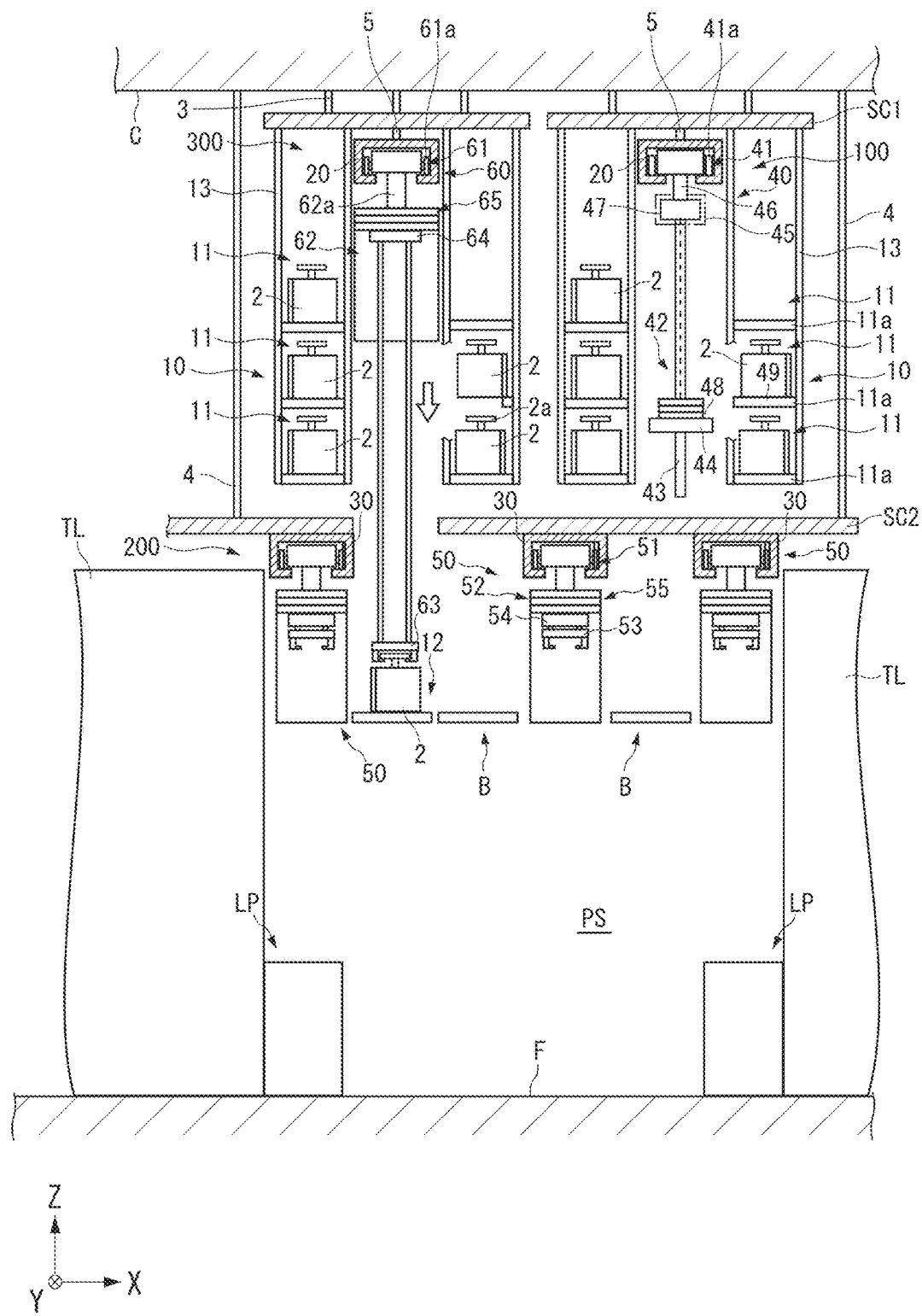
FIG. 9 is a diagram showing an operation of delivering an article to a receiving/delivering port, being performed by the transporter.

Next, the second overhead transport vehicle 60 travels along the overhead crane track 20 while holding the article 2 via the second gripper 63, and stops directly above the specified receiving/delivering port 12. Next, as shown in FIG. 9, after having driven the second lift driver 64 to lower the second gripper 63 and the article 2 and placed the article 2 on the receiving/delivering port 12, the second overhead transport vehicle 60 releases the gripping of the second gripper 63 to deliver the article 2 to the receiving/delivering port 12.

Figure 10:
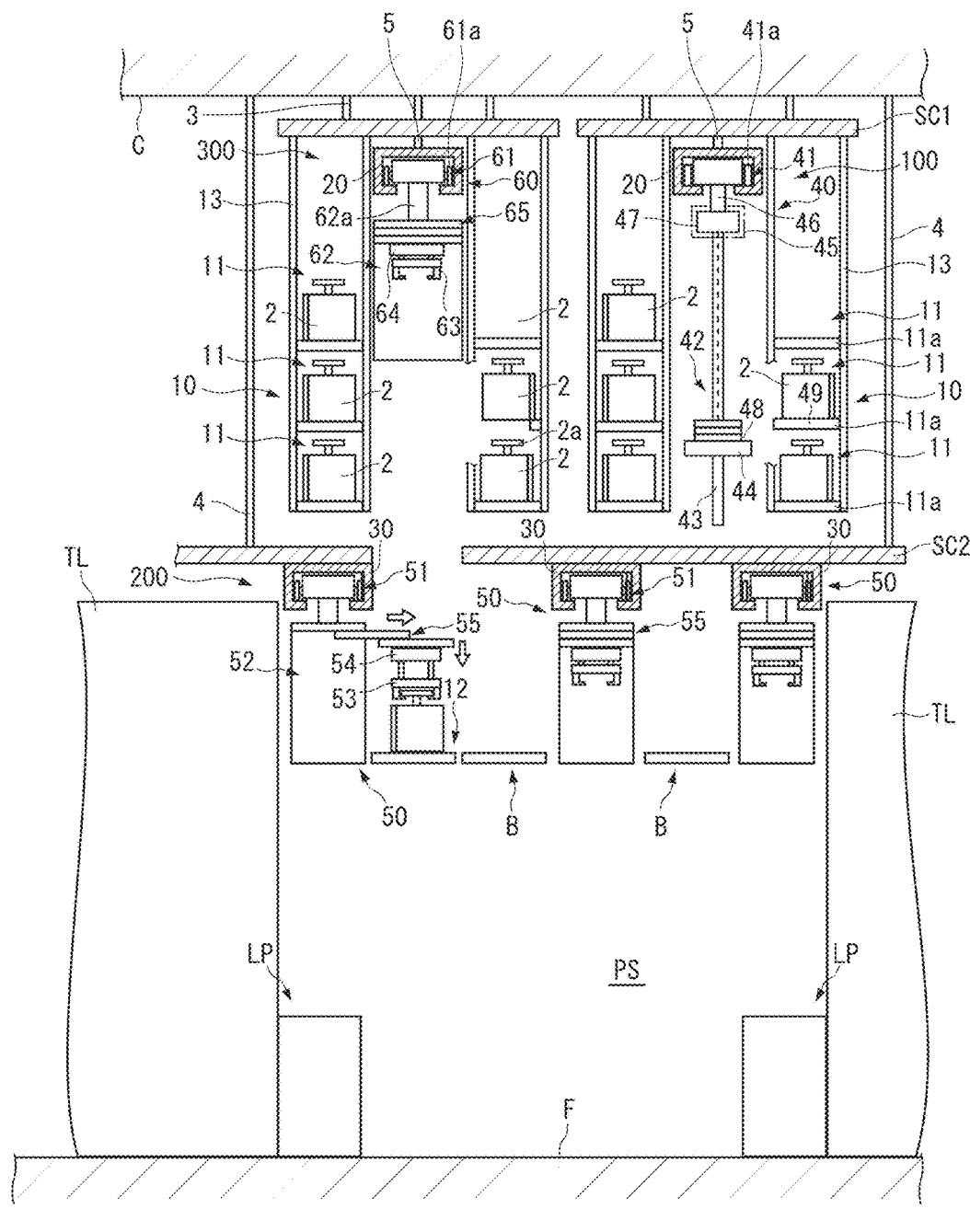
FIG. 10 is a diagram showing an operation of receiving an article from the receiving/delivering port, being performed by an overhead transport vehicle system.

Next, the controller not shown in the drawings controls the overhead transport vehicle 50 of the overhead transport vehicle system 200 to receive the article 2 from the receiving/delivering port 12 and then to deliver the article 2 to the specified load port LP. As shown in FIG. 10, after having traveled along the overhead track 30, stopped at a side of the receiving/delivering port 12 in which the article 2 is placed, and caused the lift driver 54 to project via the lateral extender 55, the overhead transport vehicle 50 lowers the gripper 53 via the lift driver 54, and grips the article 2 via the gripper 53. Then, after having raised the gripper 53 via the lift driver 54, the overhead transport vehicle 50 retracts the lateral extender 55 and returns the gripper 53 to the storing position, to thereby accommodate the article 2 in the main body 52.

Figure 11:
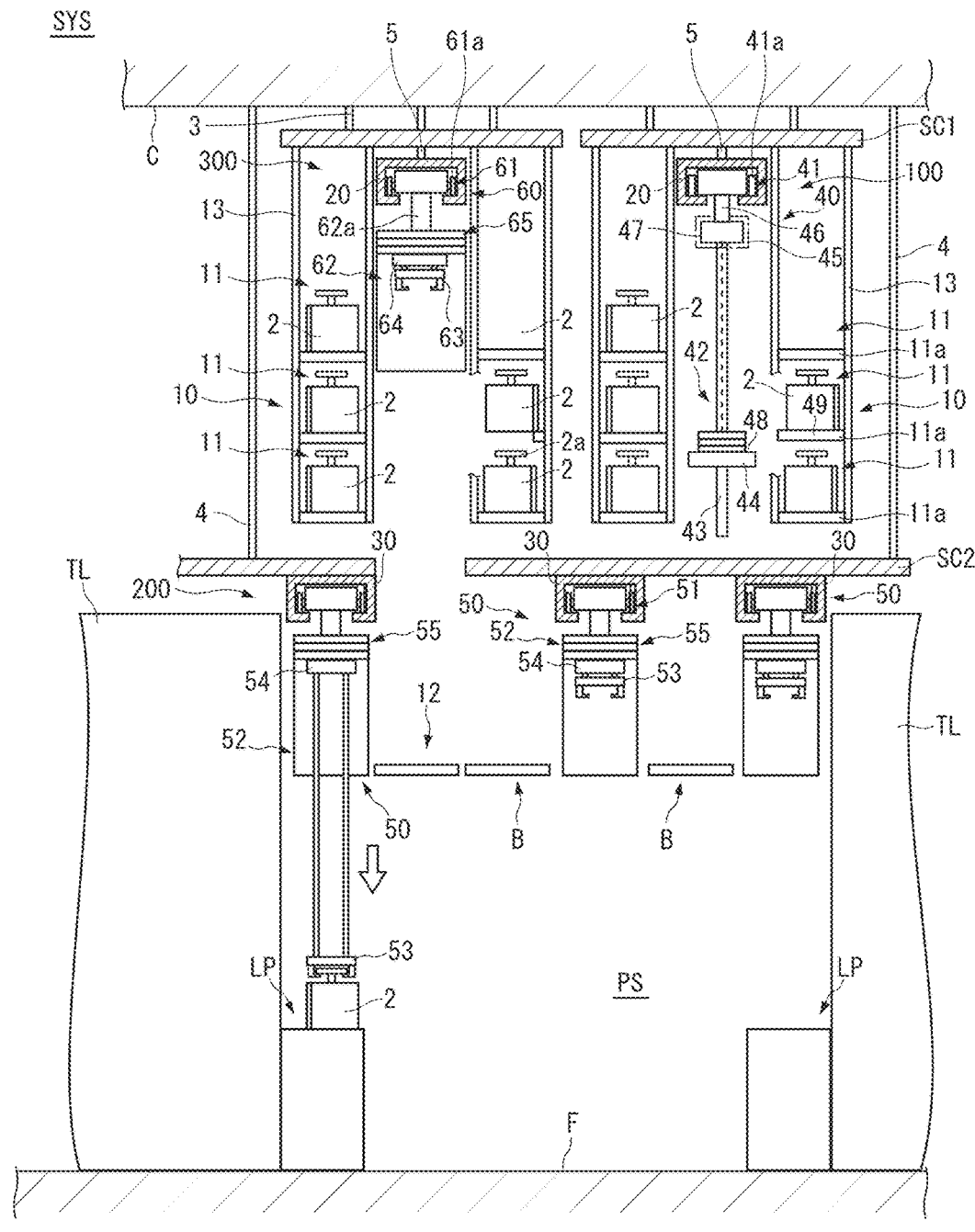
FIG. 11 is a diagram showing an operation of delivering an article to a predetermined transfer destination, being performed by the overhead transport vehicle system.

Next, the overhead transport vehicle 50 travels along the overhead track 30 while holding the article 2 via the gripper 53, and stops directly above the specified load port LP. Next, as shown in FIG. 11, after having driven the lift driver 54 to lower the gripper 53 and the article 2 and placed the article 2 on the load port LP, the overhead transport vehicle 50 releases the gripping of the gripper 53 to deliver the article 2 to the load port LP. Through the series of these operations, the article 2 is transported from the storage 11 (the shelving 10) of the overhead stocker 100 to the load port LP of the processing apparatus TL via the receiving/delivering port 12.

When transporting an article 2 from the load port LP of the processing apparatus TL to the storage 11 of the overhead stocker 100, the series of above operations shown in FIG. 8 to FIG. 11 are performed in a reversed manner. As a result, the article 2 is transported from the load port LP of the processing apparatus TL to the storage 11 of the overhead stocker 100 via the receiving/delivering port 12. In a case where the transfer destination of the article 2 is other than the load port LP, operations are similar to those described above and operations are also similar to those described above in a case where the article 2 is received from a location other than the load port LP.

As described above, according to the storage system SYS of the present preferred embodiment, the second overhead transport vehicle 60 of the overhead transport vehicle system 200 travels below the lower end of the overhead stocker 100. Therefore, even if the overhead track 30 of the overhead transport vehicle system 200 is installed to align with the load ports LP, the shelving 10 can be arranged regardless of the arrangement of the overhead track 30, and the efficiency of storing articles 2 can be improved. Moreover, storage of a large number of articles 2 becomes possible by expanding the shelving 10 easily in a horizontal direction. Since the crane 40 transfers articles 2 between the multiple tiers of storages 11, the articles 2 can easily be transferred even when the shelving 10 is expanded in the horizontal direction. Also, the second overhead transport vehicle 60 (the transporter 300) can efficiently transport articles 2 between the overhead stocker 100 and the overhead transport vehicle system 200, such that the efficiency of transporting articles 2 can be improved.

Second Preferred Embodiment

Figure 12:
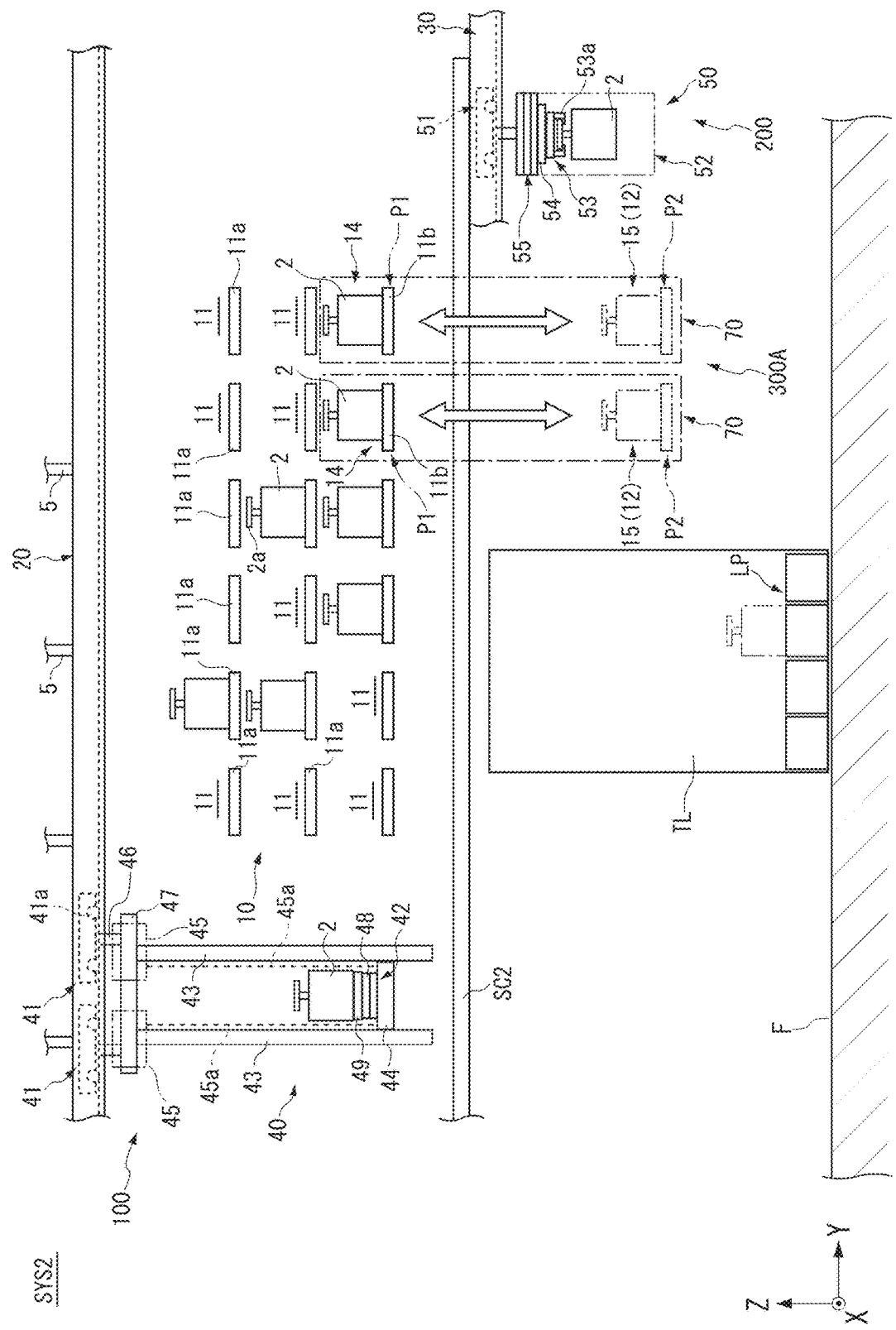
FIG. 12 is a diagram showing an example of a storage system according to a second preferred embodiment of the present invention, as viewed from the X direction.

The above first preferred embodiment described a configuration in which the transporter 300 is the second overhead transport vehicle 60, however, the present invention is not limited to this configuration. FIG. 12 is a side view showing an example of a storage system SYS2 according to a second preferred embodiment. FIG. 12 is a diagram showing the storage system SYS2 as viewed from the X direction. In the following description, the same or similar configurations as or to those in the first preferred embodiment described above are assigned with the same reference signs and the descriptions thereof are omitted or simplified.

In the storage system SYS2 shown in FIG. 12, a conveyor 70 is used as a transporter 300A. The conveyor 70 includes an upper port 14 arranged in a portion of the lowermost tier of the plurality of storages 11, and a lower port 15 to receive or deliver an article 2 from or to the overhead transport vehicle system 200. Therefore, the lower port 15 is a receiving/delivering port 12 to receive or deliver an article 2 between the conveyor 70 (the transporter 300A) and the overhead transport vehicle system 200. An elevation shelf board 11b that can be raised and lowered in the vertical direction is arranged in the upper port 14 and the lower port 15. The elevation shelf board 11b is provided so as to allow an article 2 to be placed thereon, and can be raised or lowered between a first position P1 set in the upper port 14 and a second position P2 set in the lower port 15.

In FIG. 12, two conveyors 70 are used. In such a case, both of the two conveyors 70 may transport articles 2 to or from the overhead stocker 100, or one of the conveyors 70 may be used to transport articles 2 from the overhead stocker 100 and the other conveyor 70 may be used to transport articles 2 into the overhead stocker 100. The number of conveyors 70 is arbitrary, and a single conveyor 70 may be used as the transporter 300A, or three or more conveyors 70 may be used.

In the storage system SYS2, when transporting an article 2 from the storage system 11 to the load port LP, the controller not shown in the drawings controls the crane 40 so that the crane 40 of the overhead stocker 100 moves the article 2 from the storage 11 to the upper port 14. After having received the article 2 from the predetermined storage 11, the crane 40 travels along the overhead crane track 20 and stops at the side of the upper port 14 to deliver the article 2 to the elevation shelf board 11b in the upper port 14 via the transferer 42. The article 2 is transported from the storage 11 to the upper port 14 through this operation.

Subsequently, the controller not shown in the drawings controls the conveyor 70 so that the conveyor 70 transports the article 2 from the upper port 14 to the lower port 15. The conveyor 70 lowers the elevation shelf board 11b with the article 2 placed thereon from the first position P1 to the second position P2. As a result, the article 2 moves to the lower port 15. That is to say, the article 2 is now placed on the receiving/delivering port 12.

Next, the controller not shown in the drawings controls the overhead transport vehicle 50 so that the overhead transport vehicle 50 of the overhead transport vehicle system 200 receives the article 2 from the elevation shelf board 11b of the lower port 15 and then delivers it to the load port LP. After having traveled along the overhead track 30, stopped at a side of the elevation shelf board 11b of the lower port 15 in which the article 2 is placed, and caused the lateral extender 55 to project, the overhead transport vehicle 50 lowers the gripper 53 via the lift driver 54, and grips the article 2 via the gripper 53. Then, after having raised the gripper 53 via the lift driver 54, the overhead transport vehicle 50 retracts the lateral extender 55 and returns the gripper 53 to the storing position, to accommodate the article 2 in the main body 52.

The subsequent operation is similar to that of the above first preferred embodiment in that the overhead transport vehicle 50 delivers the article 2 held by the gripper 53 to the specified load port LP. When transporting the article 2 from the load port LP of the processing apparatus TL to the storage 11 of the overhead stocker 100, the article 2 is transported from the load port LP of the processing apparatus TL to the storage 11 of the overhead stocker 100 via the elevation shelf board 11b of the conveyor 70, by performing the above operations in the reversed manner. In a case where the transfer destination of the article 2 is other than the load port LP, operations are similar to those described above, and in a case where the article 2 is received from a location other than the load port LP, operations are also similar to those described above.

As described above, according to the storage system SYS2 of the second preferred embodiment, as with the storage system SYS of the first preferred embodiment, even if the overhead track 30 of the overhead transport vehicle system 200 is installed to align with the load ports LP, the shelving 10 can be arranged regardless of the arrangement of the overhead track 30, and the efficiency of storing articles 2 can be improved. Moreover, storage of a large number of articles 2 becomes possible by expanding the shelving 10 easily in a horizontal direction. Since the crane 40 transfers articles 2 between the multiple tiers of storages 11, the articles 2 can easily be transferred even when the shelving 10 is expanded in the horizontal direction. Also, the conveyor 70 (the transporter 300A) can efficiently transport articles 2 between the overhead stocker 100 and the overhead transport vehicle system 200, such that the efficiency of transporting articles 2 can be improved.

In the storage system SYS2, for example, a local transport trolley may be used instead of the conveyor 70, which serves as the transporter 300A. This local transport trolley travels along a local track that is provided from directly above one or more storages 11 to directly above the receiving/delivering port 12, and includes a hoist that raises or lowers an article 2 while holding it. After having traveled along the local track, received an article 2 placed in the storage 11 directly below the local track, traveled along the local track, and stopped directly above the receiving/delivering port 12, the local transport trolley can deliver the article 2 to the receiving/delivering port 12 via the hoist lowering the article 2. Also, after having received an article 2 placed in the receiving/delivering port 12 and raised the article 2 via the hoist, the local transport trolley travels along the local track and stops directly above the storage 11. Then, the local transport trolley can deliver the article 2 to the storage 11 directly below the local transport trolley.

As described above, in the storage system SYS2, even with a configuration that uses, for example, a local transport trolley as a transporter instead of the conveyor 70, articles 2 can be transported vertically between the overhead stocker 100 and the overhead transport vehicle system 200.

The preferred embodiments of the present invention have been described above. However, the present invention is not limited to the above description, and various modifications may be made without departing from the gist of the present invention. For example, in the above preferred embodiments, the configuration in which the overhead crane track 20 and the overhead track 30 are not connected in the storage systems SYS, SYS2, has been described as an example. However, the present invention is not limited to this configuration. For example, the overhead crane track 20 and the overhead track 30 may be connected via connection tracks or the like.

Also, in the above preferred embodiments, the configuration in which the shelving 10, the overhead crane track 20, and the overhead track 30 are suspended from the ceiling C or from the system ceilings SC1, SC2 in the storage systems SYS, SYS2, has been described as an example. However, the present invention is not limited to this configuration. For example, at least one of the shelving 10, the overhead crane track 20, and the overhead track 30 may be supported by a supporting column, a frame, a pedestal, or the like provided on the floor surface F, so that the floor surface F bears the load of the shelving 10 and so forth.

One or more of the elements or features described in the above preferred embodiments may be omitted in some cases. One or more of the elements or features described in the above preferred embodiments may be appropriately combined. The contents of Japanese Patent Application No. 2018-242936 and all documents cited in the detailed description of the present invention are incorporated herein by reference to the extent permitted by law.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A storage system comprising:
    an overhead stocker including an overhead crane track, shelving in which a plurality of tiers of storages to accommodate articles therein are arranged vertically, and a crane to travel along the overhead crane track and transfer an article between the plurality of tiers of storages;
    an overhead transport vehicle system to perform receiving or delivering of an article from or to a predetermined transfer destination;
    a transporter to vertically transport an article between the overhead stocker and the overhead transport vehicle system; and
    a receiving/delivering port to receive or deliver an article between the overhead transport vehicle system and the transporter; wherein
    the overhead transport vehicle system is provided below a lower end of the overhead stocker;
    the transporter includes:
        a transporter lift driver to raise or lower an article being held; and
        a transporter lateral extender to move the transporter lift driver laterally between a position above the receiving/delivering port and a position above at least one of the plurality of tiers of storages;
    the transporter is capable of receiving or delivering an article from or to the receiving/delivering port by raising or lowering the article via the transporter lift driver in a state in which the transporter lift driver is situated above the receiving/delivering port; and
    the transporter is capable of receiving or delivering an article from or to the storage that is present below the transporter lift driver by raising or lowering the article via the transporter lift driver in a state in which the transporter lift driver is situated above at least one of the plurality of tiers of storages.

2. The storage system according to claim 1, wherein a plurality of the receiving/delivering ports are provided.

3. The storage system according to claim 1, wherein the overhead transport vehicle system includes:
    an overhead track below the lower end of the overhead stocker; and
    an overhead transport vehicle including a traveler to travel along the overhead track, a lift driver to raise or lower an article being held, and a lateral extender to move the lift driver laterally with respect to the traveler; wherein
    the receiving/delivering port is provided on a lateral side of and below the overhead track; and
    the overhead transport vehicle is capable of receiving or delivering an article from or to the predetermined transfer destination by raising or lowering the article via the lift driver, and is capable of receiving or delivering an article from or to the receiving/delivering port that is present below the lift driver having been moved by the lateral extender, by raising or lowering the article via the lift driver in the state where the lateral extender has moved the lift driver to above the receiving/delivering port.

4. The storage system according to claim 1, wherein
    the transporter includes a transporter traveler to travel on the overhead crane track; and
    the receiving/delivering port is provided below the transporter.

5. The storage system according to claim 1, wherein the receiving/delivering port and the predetermined transfer destination are not aligned as viewed in a plan view.

6. The storage system according to claim 1, wherein a portion of the shelving and the predetermined transfer destination overlap with each other as viewed in a plan view.

7. The storage system according to claim 1, wherein
the crane includes a crane traveler to travel on the overhead crane track and a transferer to transfer an article between the plurality of tiers of the storages; and
the transferer includes a mast that extends in a vertical direction while being suspended from the crane traveler, an elevation platform to ascend or descend along the mast, a driver to raise or lower the elevation platform, an extender/retractor capable of extending from and retracting to the elevation platform, in a direction perpendicular or substantially perpendicular to a traveling direction of the crane traveler, and a holder that is provided at a distal end of the extender/retractor to hold an article.

* * * * *